US008998606B2

(12) United States Patent
Alexander et al.

(10) Patent No.: US 8,998,606 B2
(45) Date of Patent: Apr. 7, 2015

(54) APPARATUS AND METHOD UTILIZING FORCED CONVECTION FOR UNIFORM THERMAL TREATMENT OF THIN FILM DEVICES

(75) Inventors: Paul Alexander, San Jose, CA (US); Steven Aragon, Campbell, CA (US)

(73) Assignee: Stion Corporation, San Jose, CA (US)

( * ) Notice: Subject to any disclaimer, the term of this patent is extended or adjusted under 35 U.S.C. 154(b) by 522 days.

(21) Appl. No.: 13/343,531

(22) Filed: Jan. 4, 2012

(65) Prior Publication Data
US 2012/0237885 A1   Sep. 20, 2012

Related U.S. Application Data

(60) Provisional application No. 61/432,775, filed on Jan. 14, 2011.

(51) Int. Cl.
*F27D 7/02* (2006.01)
*H01L 21/67* (2006.01)
*H01L 21/324* (2006.01)

(52) U.S. Cl.
CPC ........ *H01L 21/67109* (2013.01); *H01L 21/324* (2013.01)

(58) Field of Classification Search
USPC ............ 432/247, 253, 261; 438/57, 522, 550; 118/715, 724, 725, 729
See application file for complete search history.

(56) References Cited

U.S. PATENT DOCUMENTS

| | | |
|---|---|---|
| 3,520,732 A | 7/1970 | Nakayama et al. |
| 3,673,981 A * | 7/1972 | Beckham et al. ............. 118/676 |
| 3,828,722 A | 8/1974 | Reuter et al. |
| 3,975,211 A | 8/1976 | Shirland |
| 4,062,038 A | 12/1977 | Cuomo et al. |
| 4,263,336 A | 4/1981 | Thompson et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |

(Continued)

OTHER PUBLICATIONS

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

*Primary Examiner* — Gregory A Wilson
(74) *Attorney, Agent, or Firm* — Kilpatrick Townsend & Stockton LLP

(57) ABSTRACT

An apparatus for uniform reactive thermal treatment of thin-film materials includes a chamber enclosing a tube shaped space filled with a work gas and heaters disposed outside the chamber. The apparatus further includes a loading configuration for subjecting a plurality of planar substrates to the work gas in the tube shaped space. Baffles are disposed above and below the loading configuration.

23 Claims, 6 Drawing Sheets

(56) References Cited

U.S. PATENT DOCUMENTS

| | | |
|---|---|---|
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A * | 11/1993 | Yamabe et al. ............... 118/725 |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,933,009 B2 * | 8/2005 | Ueda et al. ............... 427/248.1 |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,398,772 B1 * | 3/2013 | Tandon et al. ............... 118/724 |
| 8,461,061 B2 * | 6/2013 | Alexander et al. ............ 438/795 |
| 2001/0007246 A1 * | 7/2001 | Ueda et al. ............... 118/724 |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0203124 A1 * | 10/2003 | Ueda et al. ............... 427/569 |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |

(56) References Cited

U.S. PATENT DOCUMENTS

| | | |
|---|---|---|
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 * | 4/2008 | Lee .................. 136/261 |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269089 A1 * | 11/2011 | Echizenya et al. ............ 432/221 |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0264072 A1 * | 10/2012 | Tandon ..................... 432/18 |

* cited by examiner

APPARATUS AND METHOD UTILIZING FORCED CONVECTION FOR UNIFORM THERMAL TREATMENT OF THIN FILM DEVICES

CROSS-REFERENCE TO RELATED APPLICATION

This application claims priority to U.S. Provisional Patent Application No. 61/432,775, filed Jan. 14, 2011, commonly assigned, and hereby incorporated by reference in its entirety herein for all purpose.

BACKGROUND OF THE INVENTION

The present invention relates generally to photovoltaic materials and manufacturing method. More particularly, the present invention provides a method and apparatus for uniform thermal treatment of thin film photovoltaic devices. Merely by way of example, embodiments of the present invention include a method and apparatus utilizing forced convection for performing efficient thermal treatment of photovoltaic thin-film material with improved temperature uniformity, but it would be recognized that the invention may have other configurations.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable source energy has been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

As an effort to improve thin film solar cell technology, one or more processes of manufacturing an advanced CIGS/CIS based photovoltaic film stack on sized substrates with planar, tubular, cylindrical, circular or other shapes are introduced. There are various manufacturing challenges in forming the photovoltaic film stack, such as maintaining structure integrity of substrates, controlling chemical compositions of the ingredients in one or more precursor layers, carrying out proper reactive thermal treatment of the one or more precursor layers within a desired gaseous environment, ensuring uniformity and granularity of the thin film materials during reactive thermal treatment, etc. Especially, when manufacturing the thin film based solar device on substrates with large form factors, temperature uniformity across whole substrate surface is desired. While conventional techniques in the past have addressed some of these issues, they are often inadequate in various situations. Therefore, it is desirable to have improved apparatus and method for processing thin film photovoltaic devices on planar or non-planar shaped, fixed or flexible substrates.

BRIEF SUMMARY OF THE INVENTION

Embodiments according to the present invention relate to thin-film photovoltaic materials and manufacturing method. More particularly, the present invention provides a method and apparatus for uniform thermal treatment of thin-film photovoltaic devices. Merely by way of example, the present method and apparatus utilizes forced convection to maintain a temperature profile with shorter run-time and improved temperature uniformity for the manufacture of thin-film based photovoltaic devices, but it would be recognized that the invention may have other configurations.

In a specific embodiment, the present invention provides an apparatus for uniform reactive thermal treatment of thin-film materials. The apparatus includes a chamber enclosing a tube shaped space extended horizontally in an axial direction from a first end region to a vicinity of a second end region. The tube shaped space is filled with a work gas. The apparatus includes one or more heaters disposed at a peripheral outside of the chamber to provide thermal energy for heating the chamber. The apparatus further includes a loading configuration for subjecting a plurality of substrates to the work gas in the tube shaped space. Each of the plurality of substrates is spatially arranged with a separation to each neighbor. Additionally, the apparatus includes a first baffle member disposed above the loading configuration and a second baffle member disposed under the loading configuration. The second baffle member is at a distance below the first baffle member. Furthermore, the apparatus includes a third baffle member disposed near the first end region in front of the loading configuration. Moreover, the apparatus includes a blower disposed between the third baffle member and the loading configuration. The blower faces the axial direction and has a radial dimension substantially equal to the distance between the first baffle member and the second baffle member.

In a specific embodiment, each of the plurality of substrates includes a thin-film material comprising copper, indium, and/or gallium species formed on a planar shaped soda lime glass. The soda lime glass substrate has a form factor ranging from 20×20 cm to 65×165 cm. The plurality of substrates is loaded inside the chamber to be subjected to a work gas comprising at least selenide or sulfide species during a reactive thermal treatment following a predetermined temperature profile. In an embodiment, the temperature profile is characterized by a temperature ramping stage and a processing stage. By utilizing the forced convection created by the blower, the processing stage is controlled within a temperature range across the plurality of substrates no more than 20° C. The transition time from the temperature ramping stage to the processing stage is reduced to substantially less than 0.75 hours for treating a plurality of substrates having a form factor as large as 65×165 cm. In another specific embodiment, the predetermined temperature profile includes one or more cooling stages, wherein another run-time from the processing stage to a cooled stage is reduced substantially by utilizing the forced convection comparing to just natural convection.

In an alternative embodiment of the present invention, a method for uniformly treating thin film devices utilizing a forced convection of a work gas is provided. The method includes providing a furnace having a tube shape extended horizontally along an axial direction from a first end region to a second end region. The method further includes loading a plurality of substrates into the furnace and disposing a first baffle member above the plurality of substrates and a second baffle member under the plurality of substrates. Additionally, the method includes disposing a third baffle member near the first end region in front of the plurality of substrates. The method further includes filling the furnace with a work gas and providing thermal energy to heat the work gas from one or more heaters placed surrounding the furnace for treating the plurality of substrates. Furthermore, the method includes operating a blower disposed between the third baffle member and the plurality of substrates to create a forced convection current of the work gas flowing through the plurality of substrates between the first baffle member and the second baffle member.

Many benefits can be achieved by ways of the embodiments according to the present invention. Particularly, the method provides a method for performing reactive thermal treatment of thin-film materials on a plurality of substrates to form a photovoltaic absorber for a thin-film PV device. Some embodiments of the present invention provide an apparatus including a furnace filled with a work gas in a heated tube shape space for subjecting the thin-film material on the plurality of substrates to a thermal energy applied from radial direction and to a forced convection current in axial direction created by a blower disposed in front of (and/or behind) the loaded substrates. According to one or more embodiments of the present invention, a processing stage based on a predetermined temperature profile for the plurality of substrates can be reached from a ramping stage in a much reduced run-time and can be maintained with improved temperature uniformity characterized by a temperature variation substantially less than 20° C. across each of the plurality of substrates. In an alternative embodiment of the present invention utilizing forced convection in the furnace, the temperature profile can be completed via one or more cooling stages with a smaller run-time while still keeping substantially uniform substrate temperature. In a specific embodiment, the apparatus and method can be applied for treating the thin-film material on the plurality of substrates having a form factor as large as 65×165 cm. Depending on the embodiment, one or more of these benefits may be achieved. These and other benefits will be described in more detailed throughout the present specification and particularly below.

DETAILED DESCRIPTION OF THE INVENTION

Embodiments according to the present invention relate to thin-film photovoltaic materials and manufacturing method. More particularly, the present invention provides a method and apparatus utilizing forced convection for thermally treating thin-film materials with a shorter run-time and improved temperature uniformity. Merely by way of example, the present method and structure are applied for the manufacture of a copper indium gallium diselenide based thin-film photovoltaic absorber for solar devices on shaped substrates with large form factors, but it would be recognized that the invention may have other configurations.

Figure 1:
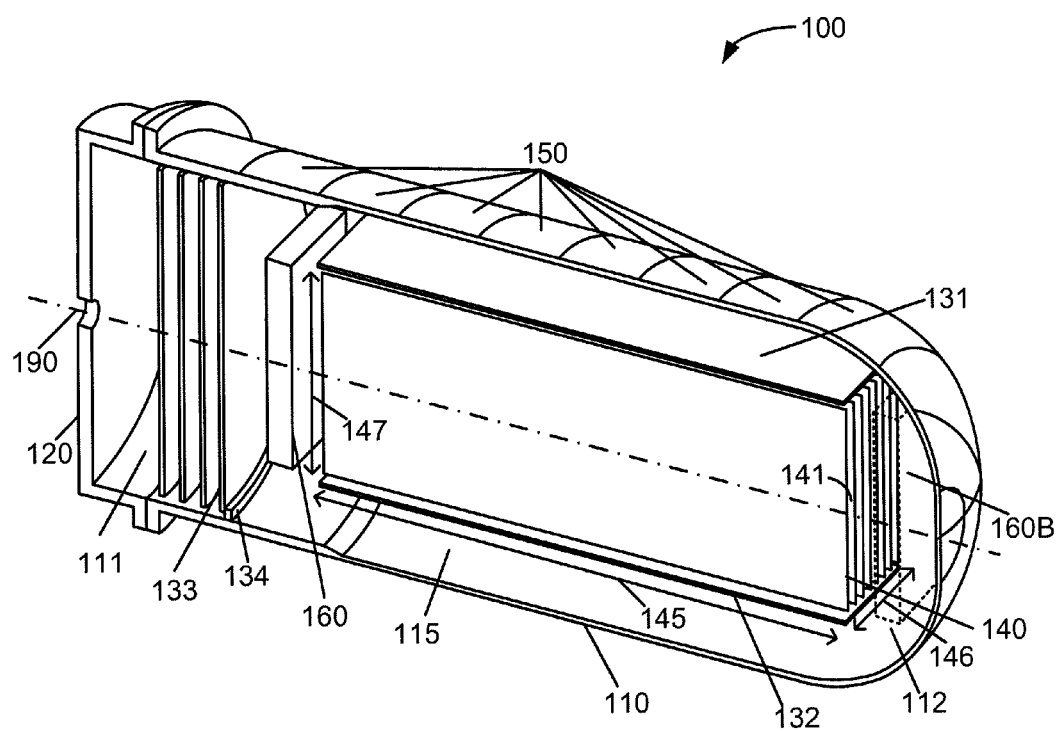
FIG. 1 is a perspective view of an apparatus for uniform thermal treatment of thin-film materials on a plurality of substrates.

FIG. 1 is a perspective view of an apparatus for uniform thermal treatment of thin-film materials on a plurality of substrates according to an embodiment of the present invention. As shown, an apparatus 100 for uniform thermal treatment of thin-film materials on a plurality of substrates includes a furnace tube (a furnace chamber in tube shape) 110. In a specific embodiment, the furnace tube 110 can be configured to have its tube axis 190 aligned in horizontal direction, although other orientations would be also applicable. The furnace tube 110 encloses a volume of space 115 in a tube shaped body extended from a first end region 111 to a second end region 112. In an embodiment, the first end region 111 is coupled to a cover member or a chamber door 120, which opens for loading or unloading work samples in/out the furnace tube 110 and closes for keeping the enclosed volume of space 115 in a specific pressured chemical environment filled with a work gas. In an implementation, the work gas (plus any carry gases) can be filled through one or more gas-supply modules (not shown) coupled to furnace tube 110. As the chamber door seals the furnace tube, the work gas can be maintained with a proper pressure range and composition range designed for a reactive thermal treatment of any work samples therein.

In another implementation, shown as an example in the FIG. 1, the work samples to be treated in the apparatus 100 are thin-film materials on a plurality of substrates 140 loaded through the chamber door 120. The plurality of substrates 140 as shown is in a rectangular planar shape, although they can be many other shapes including cylindrical or semi-spherical tubular shape or even flexible curved shape and others. A preferred type of substrate for the manufacture of thin-film solar cells is made of soda lime glass with various form factors for different applications. For example, one of the plurality of substrates 140 can be a square shape with a form factor of 20×20 cm. In another example, the substrate 140 has a form factor of 20×50 cm. In certain embodiments, substrates with form factor as large as 65×165 cm are used for the manufacture of the thin-film copper-indium-gallium-diselenide (CIGS) solar modules. In a specific embodiment, the plurality of substrates 140 is loaded in a loading configuration spatially arranged with a separation 141 between each neighboring pair, allowing the thin-film material (not explicitly visible) formed on each substrate to be exposed and subjected to the work gas inside the volume of space 115 for corresponding thermal treatment. The separation 141 also provides a spatial channel for any convection current to pass through. Other than the separation arrangement, depending on the specific shape and form factor of each substrate, the loading configuration additionally can be characterized by a physical range defined by a length scale 145, a width scale 146 (only shown its half in FIG. 1), and a height scale 147. In an example with the plurality of substrates in rectangular planar shapes, the length scale 145 corresponds to a length of each substrate, the height scale 147 corresponds to a width of the substrate, and the width scale 146 corresponds to a spatial distribution of the plurality of substrates with a specific neighboring separation. This is assumed that a physical orientation of the plurality of substrates 140 is in a vertical direction. The physical orientation is shown as an example to be in a vertical direction for facilitating natural convection of the heated work gas within the neighboring separation. Once a forced convection is created through each neighboring separation of the plurality of substrates, the physical orientation of the loading configuration is not a limited element. However, as shown in later section, for a plurality of planar substrates loaded in parallel, two baffle plates can be added to cover (with a small clearance off) the edge regions for confining the convection current within the physical range of the loading configuration.

Additionally as shown in FIG. 1, the apparatus 100 includes one or more heaters 150 being disposed around a peripheral outside of the furnace tube 110 for providing thermal energy to heat the tube shaped body. In a specific embodiment, the furnace tube 110 is made of a material that is substantially thermal conductive so that the tube shaped body 110 can be heated fast which subsequently heats the work gas and other structure members inside the tube shaped body via thermal radiation. For example, the furnace tube 110 is made of quartz material from the first end region 111 to the second end region 112, which is a good thermal conductor and relative not transparent to radiation in infrared region. Quartz material is also a good material substantially chemical inert to the work gas in elevated temperature. In another specific embodiment, the one or more heaters 150 are arranged to have multiple heating elements placed around the tube shaped body 110 to form one or more heating zones one next to another along the axial direction 190. In an example, the one or more heaters include multiple electric-powered heating tapes wrapped around the furnace tube 110. Each heating tape can be independently controllable in its power supply for tuning the thermal energy delivered to a particular heating zone, allowing a finer control of temperature uniformity within the furnace tube during the thermal treatment process. In an alternative embodiment, the apparatus 100 also include one or more cooling elements distributed around the furnace tube 110 (not shown in FIG. 1) for cooling the tube shaped body for performing one or more cooling stages associated with the thermal treatment process. Similarly, the one or more cooling elements can be configured to provide zoned cooling with relative independent control. More details about utilizing zoned heating/cooling for uniform thermal treatment of thin-film material can be found in a U.S. patent application Ser. No. 12/858,342 filed on Aug. 17, 2010, and another U.S. Patent Application No. 61/367,208 filed on Jul. 23, 2010, both commonly assigned to Stion Corporation, San Jose, and incorporated as references for all purposes.

Referring to FIG. 1, the apparatus 100 further includes a first baffle member 131 and a second baffle member 132 respectively disposed inside the furnace tube 110 for purposely confining or restricting convection current therein. In a specific embodiment, the first baffle member 131 and the second baffle member 132 are respectively two rectangular plates positioned above and under the loading configuration of the plurality of substrates 140. The plate 131 is in a substantially horizontal plane in parallel to the axial direction 190 and has a small clearance off a top portion of the physical range associated with the substrate loading configuration. As shown in FIG. 1, the plate 131 is placed at least a distance above top edges of the plurality of substrates 140 loaded in parallel vertically. Similarly, the plate 132 is positioned at a horizontal plane in parallel to the axial direction 190 and a clearance distance under the bottom edges of the plurality of substrates. Of course, there is always a supporting fixture (not shown) at the bottom portion of the loading configuration, the second baffle member 132 can be configured to fit in the space allowed by any of the specific supporting fixture for loading the substrates. The second baffle member 132 is located at a distance below the first baffle member 131, and in certain embodiment is substantially in parallel to each other. With the two plates being respectively placed a substantial small clearance off the substrate loading configuration, the distance between the two baffle members are substantially equal to or slightly bigger than the height scale 147 of the physical range associated with the loading configuration. Functionally, the two plates provide a spatial arrangement for at least partially confining any convection current flowing along the axial direction 190 of the furnace tube 110 through the plurality of substrates 140. The forced convection with spatial confinement helps to determine a flow velocity profile across each of the plurality of substrates, which correspondingly is associated with a temperature profile maintained for treating the thin-film material on substrates. In another specific embodiment, each of the first baffle member 131 and the second baffle member is made of a material that is substantially thermal conductive and can be quickly heated by the heated tube shaped body 110 via thermal radiation. In an example, both the first baffle member 131 and the second baffle member 132 are made of quartz material. While the major role of the first and second baffle member is for guiding the convection current within the substrate loading configuration for effective thermal treatment. Other types of materials certainly are applicable. As the orientation of the substrate loading configuration does not have a preferred direction when a forced convection current is utilized, the forced convection current is preferred to be confined by the two baffle members disposed respectively near edges of the plurality of substrates in the loading configuration. The two substrates located at outermost position of the loading configuration naturally serve as guides for the forced convection current within the physical range of the loading configuration. More details description about a convection current through the separation between neighboring substrates can be found throughout the specification and specifically in following sections.

Referring again to FIG. 1, the apparatus 100 includes a method 100 begins with a third baffle member 133 disposed between the first end region 111 and a side region of the physical range associated with the loading configuration of the plurality of substrates 140. The third baffle member 133 includes two or more disk shaped plates substantially covers most interior cross-section area of the tube shaped body 110 except a small peripheral gap off an inner wall of the furnace tube 110. For example, the two or more disk shaped plates are coupled to a rack fixture that is used for supporting and loading the plurality of substrates 140. When the substrates are loaded through the chamber door 120 into the loading configuration in the volume of space 115, these disk shaped plates are disposed in their positions. The peripheral gap simply allows a free movement of these plates following the coupled rack fixture. By covering the substantial portion of the cross-section area, the third baffle member 133 can effectively block the heated work gas from reaching the cold chamber door 120. The chamber door 120 usually is kept cool (cooled by interior water pipes) at room temperature or below for avoiding reaction with the work gas and ensure no thermal-induced damage to the vacuum sealing material between the chamber door 120 and the first end region 111 of the furnace tube 110. The third baffle member 133 is also made of quartz material which is a not transparent to infrared radiation and can be used as an effective radiation blocker. In an example with n numbers of the disk plates spatially arranged with a gap from one to next, only an 1/(n+1) portion of thermal energy may pass through. In addition, the third baffle member restricts convection substantially within the physical range of the substrate loading configuration within the volume of space 115, which helps to improve temperature uniformity. In a specific embodiment, the apparatus 100 also includes a crescent shaped baffle member 134 to cover a lower section of peripheral gap off the lower portion of the inner wall. The crescent shaped baffle member 134 blocks a return current of any leaked work gas cooled by the chamber door 120 back to the volume of space 115, as cooled gas turns to flow along the lower portion of the furnace tube. More details about the function of crescent baffle for improving temperature uniformity in the process region can be found in U.S. patent application Ser. No. 12/858,342, titled "Method and Structure For Processing Thin Film PV Cells with Improved Temperature Uniformity", filed on Aug. 17, 2010, commonly assigned to Stion Corporation, San Jose, and incorporated as references for all purposes.

In a specific embodiment, the apparatus 100 includes a blower 160 disposed between the third baffle member 133 and the physical range associated with the loading configuration of the plurality of substrates 140. For example, the blower 160 is a motorized axial fan or a combination of multiple axial fans all facing the axial direction 190. The axial fan(s) can be configured to adjust fan speed for creating a forced convection current with desired flow velocities in the axial direction 190. The blower 160 is further configured to have a radial dimension substantially equal to the distance (or the height scale 147) between the first baffle member 131 and the second baffle member 132 so that the forced convection current is confined within the physical range associated with the loading configuration. When the plurality of substrates is in the loading configuration, the forced convection current is able to pass through the separation between neighboring substrates. Of course, there can be many variations, alternatives, and modifications. For example, a second blower 160B can be installed near the second end region 112 for further tuning the flow velocities of the convection current through the substrates for additional improvement. More detail descriptions about creating a forced convection current and associated flow velocity profile can be found in following sections of the specification.

Figure 2:
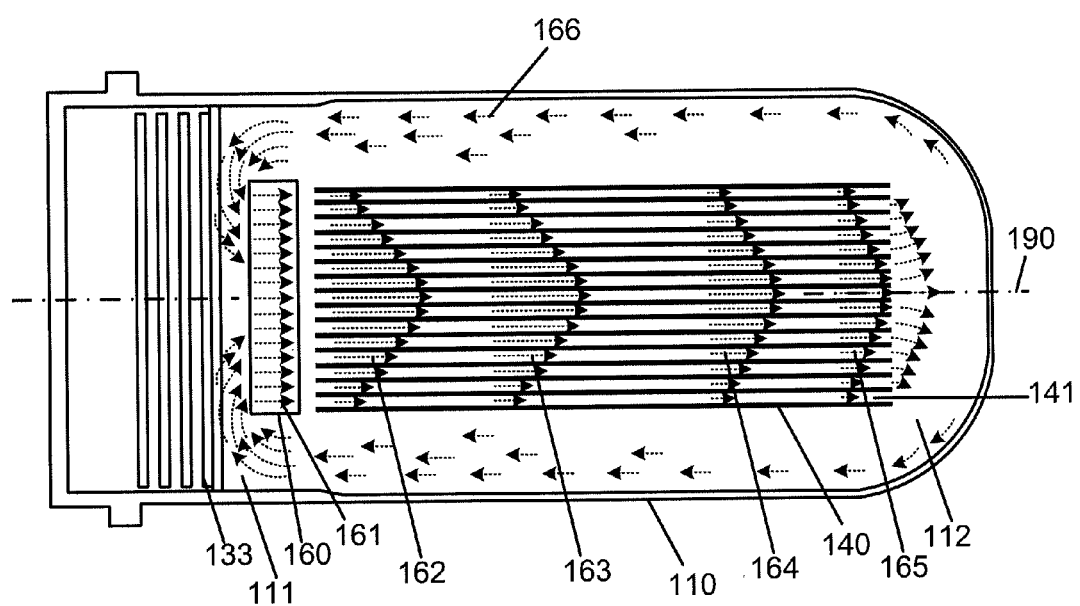
FIG. 2 is a cross-sectional top view of an apparatus utilizing an exemplary forced convection for a uniform thermal treatment of thin-film materials on a plurality of substrates.

FIG. 2 is a cross-sectional top view of an apparatus utilizing an exemplary forced convection for a uniform thermal treatment of thin-film materials on a plurality of substrates according to an embodiment of the present invention. As shown, a furnace tube 110 includes a number of planar substrates 140 loaded substantially in parallel to an axial direction 190 and a vertical direction (out of the paper) with a separated gap 141 between each neighboring substrate. This loading configuration is merely an example. Other substrate orientations certainly are applicable and other shapes of the substrates are applicable without unduly limit the claims herein. In the example, an axial fan or blower 160 is placed near a first end region 111 in front of the loaded substrates 140. The axial fan 160 creates a forced convection current with an exemplary flow velocity profile denoted by the arrows passing through all separated gaps 141 along an axial direction 190. In particular, the flow velocity within a region 161 of the fan 160 is configured to be substantially uniform. After the convection current flows into the separated gaps 141, the flow velocity becomes less uniform due to leakage through the edges of the loading configuration of the number of substrates 140. For example, near the entry region 162 of the substrate loading configuration, flow velocities near the center portion are higher than those near two edge portion. Along the axial direction from region 163, 164, towards the exit region 165, the flow velocity profile may change gradually with a slower magnitude and more uniform again. The convection current is recycled from the second end region 112 through a spatial region 166 between the inner wall of furnace tube 110 and two substrates located at two opposite sides of the loading configuration. As shown, several baffle members 133 disposed in front of the fan 160 are in position for substantially restricting the recycled convection current from region 166 and guiding the current back to the fan 160. Of course, there are many variations, alternatives, and modifications. For example, the fan 160 can be configured to set an initial non-uniform flow velocity profile within fan region 161 and to achieve a more uniform flow velocity profile in regions 162, 163, or 164. The magnitude of the flow velocity can also be tuned for achieving optimized performance in terms of both a shorter run-time to reach a stable processing stage and the temperature variation within the processing stage. In another example, the fan or blower 160 is generally a flow driver. In a specific example, the fan 160 is configured to be one or more flow amplifiers which can be made with motion-free parts and by chemical inert material specifically designated for the reactive thermal environment.

Figure 3:
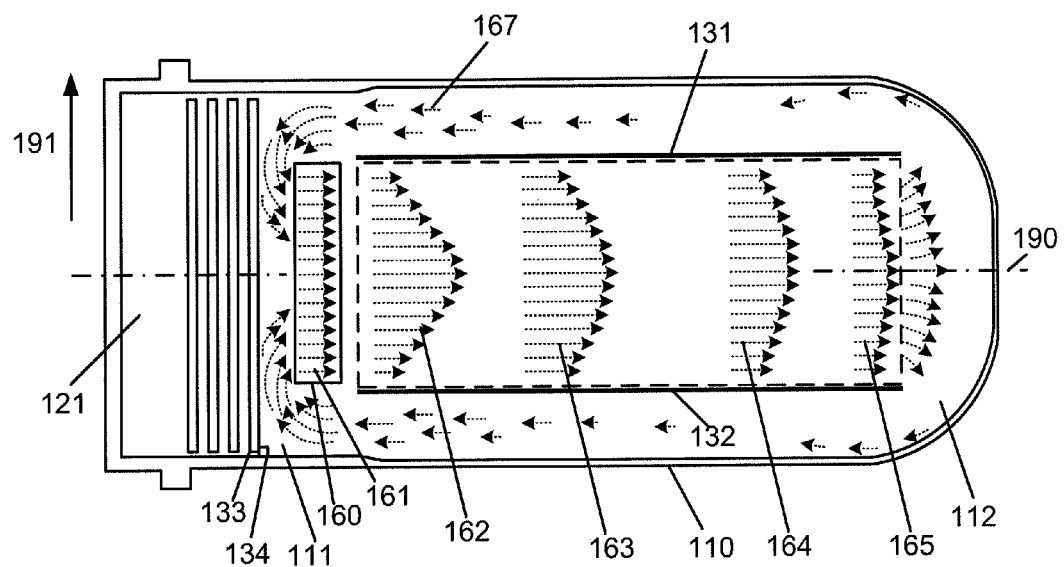
FIG. 3 is a cross-sectional side view of the apparatus utilizing the exemplary forced convection for a uniform thermal treatment of thin-film materials on a plurality of substrates.

FIG. 3 is a cross-sectional side view of the apparatus utilizing the exemplary forced convection for a uniform thermal treatment of thin-film materials on a plurality of substrates according to an embodiment of the present invention. As shown, the same furnace tube 110 in FIG. 2 is viewed from side with the substrates (shown in a dashed rectangle) being loaded in vertical direction 191. In the FIG. 3, the convection current is illustrated within a separated gap of the two substrates near center of the loading configuration. Also in this side view two baffle plates 131 and 132 are viewed as two line sections respectively located with a small clearance spacing above a top edge or under a bottom edge of the substrate. Still the arrows are used to represent the flow velocities in various regions 162, 163, 164, and 165 along the axial direction 190 across the substrates. Again, due to edge region leakage, the flow velocity profile within the physical range confined by the two baffle plates 131 and 132 shows some kind of non-uniformity. Near the center axis, the velocity is relatively higher than the edge region.

As pointed out in last paragraph, the flow velocity profile can be tuned by reconfiguring the blower 160 to have a combination of axial fans with fan speed ranges respectively controlled. Some correlations are found between the flow velocity profile and the substrate temperature uniformity, although it is not a critical factor for reducing the run-time from temperature ramping stage to reach a stable processing stage. After the convection current exits the confined region between the two baffle members, in this side view, it is also recycled through the spatial region 167 between the inner wall of the furnace tube 110 and the two baffle members 131 and 132. When the recycled current is near the front side of the blower 160, it is substantially prevented from leaking out to a chamber door region 121 by several disk shaped plates 133 placed in the first end region 111. The disk shaped plates 133 also substantially reduce a passage of thermal radiation from the volume of space 115 to the chamber door region 121. For example, for using n number of disk plates, probably only 1/(n+1) portion of thermal radiation is transmitted through. This structure helps to retain heated work gas within the volume of space 115 and keeps the chamber door cool (which is required for ensuring good vacuum sealing and serving as impurity absorption plate). The disk shaped baffle member also forces the recycled current from the spatial region 167 to flow back to region 161 of the blower 160 for forming a stable convection flow without lost much of its carried thermal energy. It is also noted that a fourth baffle member 134 is installed at a lower portion of the inner wall to block a small amount of work gas cooled by the cold chamber door leaking back to the volume of space 115, even though it is a substantially small amount of gas due to a narrow peripheral gap between the disk plates 133 and the inner wall of the furnace tube 110. Of course, there are many variations, alternatives, and modifications. For example, another blower (160B) may be installed near the second end region 112 for providing additional tuning of the flow velocity profile throughout the confined physical region from 162 to 165 for achieving improved temperature uniformity and a shortened run-time as well. In another example, the blower 160 is a flow driver configured to be one or more flow amplifiers which can be made without moving parts and by chemical inert material specifically designated for the reactive thermal environment.

Figure 3A:
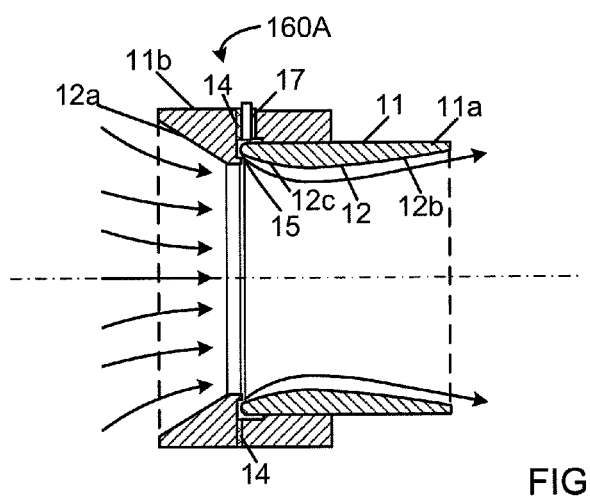
FIG. 3A is a diagram of a flow amplifier for enhancing internal forced convection.

FIG. 3A is a diagram showing a flow amplifier for enhancing internal forced convection according to an embodiment of the present invention. As shown, a flow amplifier 160A is disposed in the position of the blower 160 in FIGS. 1-3 for the seeks of removing moving parts like impellers and achieve same function of inducing forced convection current 161 within the furnace 110. The flow amplifier 160A takes advantage of the Coanda effect to utilize a small high-speed fluid from a nozzle for achieving amplification of internal convection flow. The flow amplifier 160A has an airfoil body 11 defining an inner flow passage 12 therethrough. The passage 12 has a circular shape in transverse section and includes an inlet section 12a, an outlet section 12b, and a middle section 12c. The airfoil body 11 can be made by two separate parts 11a near the outlet and 11b near the inlet, assembled by screws or other suitable means with a non-compressible gasket 14 in their joint regions. The gasket 14 is set for controlling a width of a gap between the part 11a and part 11b, forming nozzle passage 15. The nozzle passage 15 connects to a gas inlet 17 which is configured to connect an external source of compressed gas (e.g., pure nitrogen gas) pressured between 50 to 100 psig. The different flow passages, 12a, 12b, and 12c, are respectively configured to bear certain curvatures, corner structures, angles, and other geometric characteristics for achieving suitable flow speed amplification effect to the convection current through the main passage by introducing a jet of external gas with high velocity from inlet 17 through the nozzle 15 based on Coanda effect. The advantage of using this or similar kinds of flow amplifier without moving parts lies in the reduction of unwanted coating or reactive damage to the components in furnace and minimizing possibility of contamination from these components to the photovoltaic materials under the reactive thermal treatment. In a specific embodiment, the blower 160 comprises flow amplifiers 160A arranged to cover substantial transverse area in front of the end regions of the plurality of loaded substrates 140.

FIGS. 4A through 4D are respectively an exemplary time-shot of a temperature distribution across one substrate selected from a loading configuration of the plurality of substrates according to an embodiment of the present invention. Using the apparatus described in FIGS. 1-3, a forced convection is generated by a blower set in front of the plurality of planar substrates in a loading configuration, as shown in FIGS. 1-3, substantially in parallel with a separation between each neighbor. The apparatus is in operation, after pumping, purging, and work gas filling, by starting a temperature ramping stage (from time=0) following a predetermined program to approach a set point for a processing stage. FIG. 4A-4D are snap shot images taken at a time point (for example, $t_1=32$ minutes) when the set point (for example, 425° C.) is reached and a dwelling period for reaching a processing stage just starts. The time point is chosen as an example as it tends to be a moment that temperature variation may nearly reach a maximum delta T across the plurality of substrates. The blower is configured to operate the motorized fan with a flow speed of 10 m/s.

Figure 4A:
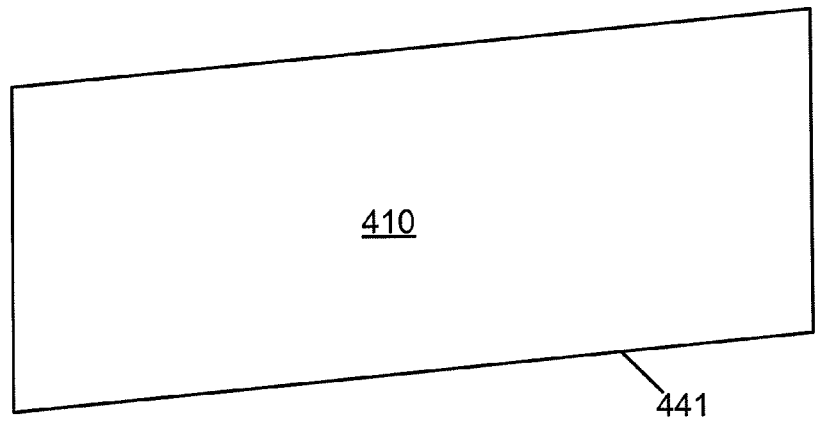
FIGS. 4A through 4D are exemplary time-shots of temperature distribution across one substrate.
Figure 4B:
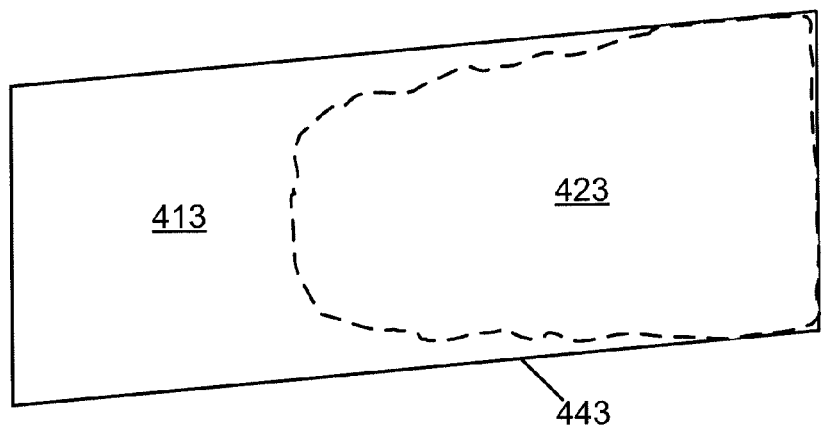
Figure 4C:
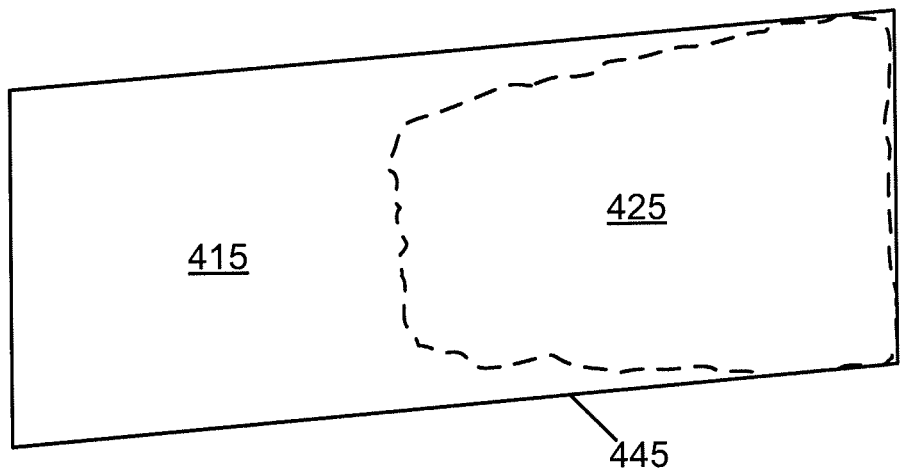
Figure 4D:
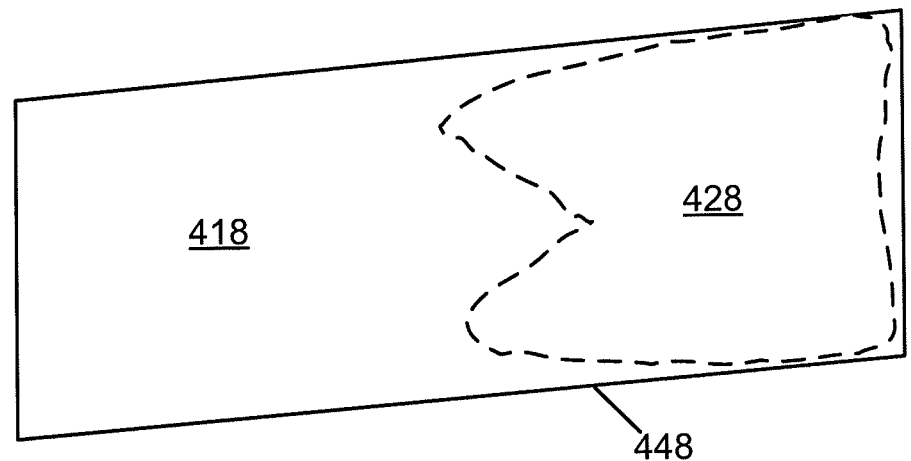

Particularly, FIG. 4A shows a temperature distribution of one substrate 441 (or the first substrate) placed near the edge of the physical range of the loading configuration. As shown, the surface region 410 is substantially uniform in temperature (at 425° C.). FIG. 4B shows a temperature distribution for another substrate 443 (#3 from the edge) where a small temperature variation (delta T is about 25° C.) exists from region 413 to region 423 as plotted in a contour map. Similarly, FIG. 4C shows a temperature distribution in contour map for substrate 445 located closer to the center of the loading configuration, also showing a temperature difference (delta T) across region 415 and region 425. FIG. 4D shows temperature contour map of a substrate 448 located at the center position of the loading configuration described earlier, revealing a temperature difference (delta T) across region 418 and 428. As shown, the size and shape of the surface region with uniform temperature certainly is varying from one substrate to another depending on location and more specifically on the convection current flow passed by (although the heating zone layout and independent control also are limiting factors). For example, for a substrate in a form factor of 20×50 cm, using a fan speed of 10 m/s a maximum delta T is about 25° C. as shown here. When the fan speed is reduced to 3 m/s, the maximum delta T could be around 100° C. When only natural convection is used, the maximum delta T can be as large as 200° C. Therefore, the effect of the forced convection on improving the substrate temperature uniformity is substantial. Of course, there are many other variations, alternatives, and modifications. For example, beyond this time point, the apparatus is operated in a transition period for approaching a processing stage with uniform temperature, during which the forced convection further substantially improves overall substrate temperature uniformity and help to shorten a run-time to reach the stable processing stage. In an implementation for substrates with a form factor of 20×50 cm, the run-time of dwell to uniform processing temperature is shortened from 1 hour using natural convection only to just about 10 minutes when using forced convection with a proper fan speed. Even for substrates with a form factor as large as 65×165 cm, the run-time of dwell to uniform processing temperature can be shorter than 45 minutes if the forced convection is properly utilized. Additionally, using the apparatus and method utilizing forced convection according to one or more embodiments the temperature range of all substrates during the processing stage can also be reduced substantially from more than 25° C. to less than 10° C.

Figure 5:
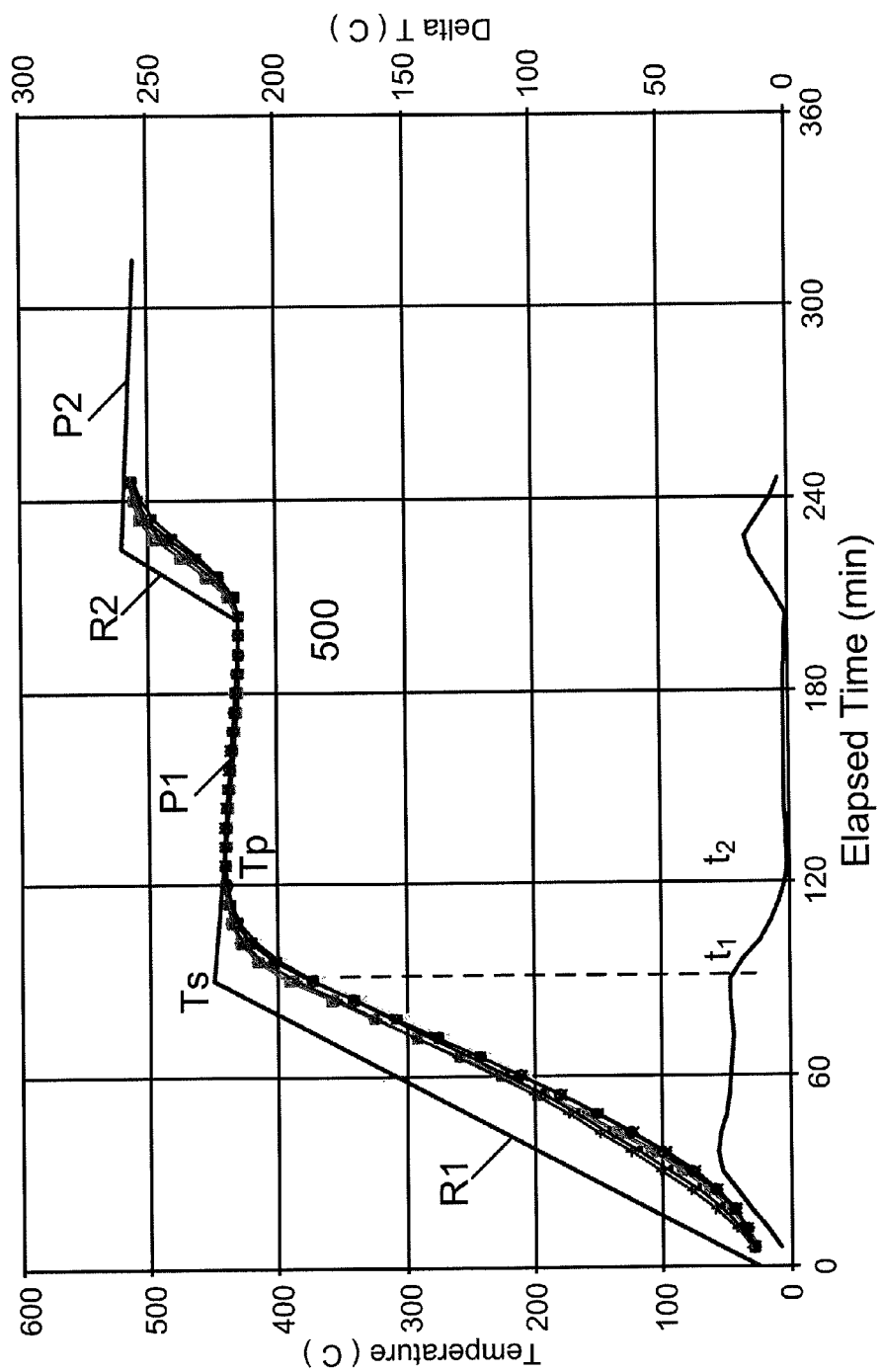
FIG. 5 is an exemplary temperature profile for performing a thermal treatment of thin-film materials on a plurality of substrates.

FIG. 5 is an exemplary temperature profile for performing a thermal treatment of thin-film materials on a plurality of substrates according to a specific embodiment of the present invention. As an example, the temperature profile 500 is applied for treating a copper-indium-gallium thin-film stack formed on a glass-based substrate in an environment containing gaseous selenium/sulfur species (for example, hydrogen selenide gas, used as the work gas) mixed with pure nitrogen gas and a small quantity of hydrogen gas (as a carry gas). The substrates having a form factor as large as 65×165 cm are loaded into a furnace tube on a fixture made by quartz material. Electric-powered heaters are disposed around the furnace tube for heating the furnace and the gases inside the furnace. In front of the substrates, a blower is operated with fan at 10 m/s for creating a forced convection current (in about 848 CFM) flowing in axial direction through the substrates. As shown, the heaters start to heat the furnace as well as the substrates from time t=0 following a predetermined temperature ramping stage R1 programmed for aiming a set point $T_s$ before approaching a first processing stage (with an expected processing temperature $T_p$=425° C.). At a time $t_1$, the heaters are controlled for dwelling to uniform processing stage P1 and the substrate temperature difference can be around 30° C. After a run-time $t_r$ at time $t_2$, the processing stage P1 is reached with a substantially uniform temperature at $T_p$, where the thin-film stack of copper-indium-gallium on each of the substrates is reactively annealed within the selenide gas environment and reacted with the gaseous selenide species to form a CIGS thin-film photovoltaic absorber material. As shown in the example, the run-time $t_r=t_2-t_1$ is just about 45 minutes. The variation range of $T_p$ is limited within 10° C. through the processing stage P1 (about 30-80 minutes). During the processing stage P1, the temperature uniformity within the substrate is even better with a delta T just less than 5° C.

FIG. 5 also shows that the temperature profile 500 may proceed to start another temperature ramping stage R2 for approaching a second processing stage P2. The forced convection method and corresponding apparatus can still provide substantially improvement in reducing run-time of dwell to uniform processing temperature and the temperature variation within the second processing stage P2. Not showing in FIG. 5, the temperature profile 500 includes one or more cooling stages to return the substrates back to a temperature near 140° C. or lower. The apparatus described in one or more embodiments, for example, apparatus 100 in FIG. 1, also includes one or more cooling elements spatially disposed around the tube shaped body for providing spatially controlled cooling power to reduce the temperatures of the furnace and the substrates therein. The forced convection created by the blower disposed in front of (or after) the plurality of substrates in loading configuration can also help to reduce the cooling time substantially. In a first cooling stage, the cooling time may be cut by 10% and a second cooling stage (after the temperature is dropped below a glass strain point) the cooling time can be cut even by 50% or more. At the same time, the temperature uniformity across all substrates is maintained well below 50° C. Again, one of ordinary skill in the art would recognize variations, modifications, and alternatives.

While the present invention has been described using specific embodiments, it should be understood that various changes, modifications, and variations to the method utilized in the present invention may be effected without departing from the spirit and scope of the present invention as defined in the appended claims. For example, the tube shaped furnace is illustrated as an example. Other shaped furnace structure that is configured to perform thermal treatment of a plurality of shaped substrates loaded in various orientations can be applied by the present invention. Correspondingly, the baffle structures can also be modified in shape and position to control the convection current. Similarly, the blower or multiple blowers can be adapted for the corresponding substrate loading configurations to generate a proper forced convection with desired flow velocity profile. Additionally, although the above embodiments described have been applied to a reactive thermal treatment of a Cu—In—Ga thin film material for forming copper-indium-diselenide (CIS) and/or copper-indium-gallium-diselenide (CIGS) photovoltaic absorber on the glass-based substrates, other thin film based thermal processes certainly can also be benefited from the one or more embodiments of present invention, without departing from the claims cited herein. Depending on the embodiment, the present method can also be applied to silicon based photovoltaic devices.

What is claimed is:

1. An apparatus for uniform thermal reactive treatment of thin-film materials, the apparatus comprising:
    a chamber enclosing a tube shaped space extended horizontally in an axial direction from a first end region to a vicinity of a second end region, the tube shaped space being filled with a work gas;
    at least one heater disposed at a peripheral outside of the chamber to provide thermal energy for heating the chamber;
    a loading configuration for subjecting a plurality of substrates to the work gas in the tube shaped space, each of the plurality of substrates being spatially arranged with a separation to each neighbor;
    a first baffle member disposed above the loading configuration;
    a second baffle member disposed under the loading configuration, the second baffle member being at a distance below the first baffle member;
    a third baffle member disposed near the first end region in front of the loading configuration; and
    a blower disposed between the third baffle member and the loading configuration, the blower facing the axial direction and having a radial dimension substantially equal to the distance between the first baffle member and the second baffle member.

2. The apparatus of claim 1 wherein the chamber comprises a quartz material substantially conductive to the thermal energy provided by the at least one heater and chemically inert to the work gas including at least a gaseous selenide species.

3. The apparatus of claim 2 wherein each of the plurality of substrates in the loading configuration comprises a thin-film material including at least copper, indium, or gallium species overlying a soda lime glass substrate, the thin-film material being subjected to a reaction with the gaseous selenide species to form a photovoltaic absorber material.

4. The apparatus of claim 3 wherein the soda lime glass substrate comprises a planar shape with a form factor selected from 20×20 cm, 20×50 cm, or 65×165 cm.

5. The apparatus of claim 1 wherein the first baffle member and the second baffle member comprise a rectangular plate disposed in parallel to the axial direction respectively with a clearance above and under the loading configuration of the plurality of substrates.

6. The apparatus of claim 1 wherein the third baffle member comprises two or more disk shaped plates disposed perpendicular to the axial direction substantially blocking a cross section of the chamber except a peripheral clearance gap off an inner wall of the chamber.

7. The apparatus of claim 6 further comprising a fourth baffle member in crescent shape in contact with at least one of the two or more disk shaped plates to cover a section of the peripheral gap off a lower portion of the inner wall of the chamber.

8. The apparatus of claim 1 wherein the blower comprises one or more motorized fans for creating a forced convection current of the work gas flowing along the axial direction through each separation of the plurality of substrates.

9. The apparatus of claim 8 wherein the blower comprises one or more flow amplifiers made by chemical inert material without moving parts and arranged to cover substantially transverse section in front of end regions of the plurality of substrates.

10. The apparatus of claim 8 wherein the forced convection current is associated with a flow velocity profile across each of the plurality of substrates determining a run-time to reach a processing stage based on a predetermined temperature profile with a maximum temperature variation substantially less than 20° C. across each of the plurality of substrates.

11. The apparatus of claim 10 further comprising a second blower disposed near the second end region behind the loading configuration, the second blower facing the axial direction for tuning the flow velocity profile across each of the plurality of substrates associated with the forced convection current.

12. A method for uniformly treating thin film devices utilizing a forced convection of a work gas, the method comprising:
providing a furnace having a tube shape extended horizontally along an axial direction from a first end region to a second end region;
loading a plurality of substrates into the furnace;
disposing a first baffle member above the plurality of substrates and a second baffle member under the plurality of substrates;
disposing a third baffle member near the first end region in front of the plurality of substrates;
filling the furnace with a work gas;
providing thermal energy to heat the furnace and the work gas from one or more heaters placed surrounding the furnace; and
operating a flow driver disposed between the third baffle member and the plurality of substrates to create a forced convection current of the work gas flowing through the plurality of substrates between the first baffle member and the second baffle member.

13. The method of claim 12 wherein the furnace, the first baffle member, and the second baffle member all are made of quartz material at least thermally conductive and chemically inert to the work gas.

14. The method of claim 12 wherein the loading a plurality of substrates comprises disposing each of the plurality of substrates in a configuration having a separation between each neighbor.

15. The method of claim 14 wherein the configuration comprises a spatial distribution of the plurality of substrates, the spatial distribution having a length substantially equal to a length of one of the plurality of substrates ranging from 20 cm to 165 cm, a height substantially equal to a width of one of the plurality of substrates ranging from 20 cm to 65 cm, and a width determined by total number of the plurality of substrates and the separation between each neighbor.

16. The method of claim 12 wherein each of the first baffle member and the second baffle member comprise a rectangular shaped plate made of a material substantially conductive to the thermal energy and chemically inert to the work gas.

17. The method of claim 16 wherein the disposing the first baffle member and the second baffle member comprise confining the plurality of substrates between the two rectangular shaped plates with a substantially small clearance for guiding the forced convection current of the work gas.

18. The method of claim 12 wherein the providing thermal energy from one or more heaters placed surrounding the furnace comprises heating one or more zones surrounding the furnace body along the axial direction.

19. The method of claim 12 where disposing the third baffle member comprises disposing two or more disk shaped plates spatially arranged with a gap to each next to cover a substantial portion of a cross-section area for blocking the heated work gas substantially from reaching out the first end region.

20. The method of claim 12 wherein the operating the flow driver comprises determining a flow velocity profile of the forced convection current through each separation of the plurality of substrates to maintain a predetermined temperature profile for treating the plurality of substrates with a form factor ranging from 20×20 cm to 65×165 cm.

21. The method of claim 20 wherein the predetermined temperature profile is characterized by a temperature ramping stage followed by a process stage with a process temperature range substantially smaller than 20° C. across each of the plurality of substrates and a transition time from the temperature ramping stage to the process range being equal to or substantially less than 0.75 hours.

22. The method of claim 12 wherein the operating the flow driver further comprises arranging one or more flow amplifiers in transverse section in front of end regions of the plurality of substrates.

23. The method of claim 12 further comprising operating a second flow driver disposed near the second end region for tuning the flow velocity profile of the forced convection current through each separation of the plurality of substrates.

* * * * *